United States Patent [19]
Legge

[11] Patent Number: 5,147,519
[45] Date of Patent: Sep. 15, 1992

[54] METHOD OF MANUFACTURING ELASTOMERS CONTAINING FINE LINE CONDUCTORS

[75] Inventor: Ronald Legge, Scottsdale, Ariz.
[73] Assignee: Motorola, Inc., Schaumburg, Ill.
[21] Appl. No.: 559,250
[22] Filed: Jul. 27, 1990
[51] Int. Cl.⁵ .................................. C23C 14/00
[52] U.S. Cl. .................. 204/192.29; 204/192.15; 427/126.3; 427/413; 427/123; 264/104
[58] Field of Search ............ 427/126.3, 413, 123; 204/192.15, 192.29; 264/104

[56] References Cited

U.S. PATENT DOCUMENTS

| | | | |
|---|---|---|---|
| Re. 28,506 | 8/1975 | Quaintance | 427/96 |
| 3,842,406 | 10/1974 | Sheridon | 346/151 |
| 3,953,625 | 4/1976 | Quaintance | 427/258 |
| 4,240,198 | 12/1980 | Alonso | 29/876 |
| 4,404,237 | 9/1983 | Eichelberger | 427/205 |
| 4,699,811 | 10/1987 | Kunces | 427/259 |
| 4,778,950 | 10/1988 | Lee | 29/25.42 |
| 4,783,594 | 11/1988 | Schulte | 357/30 |
| 4,806,922 | 2/1989 | McLaughlin | 350/343 |
| 4,808,983 | 2/1989 | Benjamin | 350/344 |
| 4,811,482 | 3/1989 | Moll | 29/848 |
| 4,830,705 | 5/1989 | Lowenstein | 156/646 |
| 4,835,859 | 6/1989 | Beckett | 29/846 |
| 4,869,170 | 9/1989 | Dahmberg | 102/202.8 |
| 4,875,989 | 10/1989 | Davis | 156/345 |
| 4,880,664 | 11/1989 | O'Dowd | 427/126.3 |

FOREIGN PATENT DOCUMENTS 9249 1/1981 Japan .................................. 427/125

Primary Examiner—Michael Lusignan
Assistant Examiner—Vi Duong Dang
Attorney, Agent, or Firm—Joe E. Barbee

[57] ABSTRACT

A predetermined conductor pattern is formed on a sacrificial substrate. The substrate and conductors are covered with an elastomeric material, which is generally an uncured liquid. The elastomer is cured to form a solid. Then the sacrificial substrate is dissolved away leaving the conductor pattern embedded in the elastomeric material.

14 Claims, 1 Drawing Sheet

METHOD OF MANUFACTURING ELASTOMERS CONTAINING FINE LINE CONDUCTORS

BACKGROUND OF THE INVENTION

This invention relates, in general, to forming conductors in flexible membranes, and more specifically to producing elastomeric materials containing patterns of fine line conductors.

Producing fine geometry electrically conducting materials, conductors with features on the order of 50 microns or less, on elastomeric materials has been difficult to achieve. The elastomer's flexible characteristic required the material to be supported in some manner for forming any type of conductor pattern either in or on the elastomer. Even when supported, the flexible property made it difficult to maintain a motionless state for the formation of small feature conductors. Additionally, elastomers could not withstand the high temperatures associated with applying conductors by evaporating or sputtering methods, therefore, the conductor materials that could be applied were limited. For those materials that could be applied reliably, silk screening or shadow mask manufacturing techniques were generally employed.

Silk screening of conductors usually employed applying conductive inks through a screen mask held in contact with the elastomer to be coated. Conducting inks that could be applied with silk screening were generally limited to metal particles suspended in a liquid or paste that could flow through the screen onto the elastomer.

Shadow masks were generally more rigid than silk screens and could support smaller geometry in the mask openings. Smaller openings facilitated improved control, but, the resulting feature size on the elastomeric material was limited not only by mask openings but also by the movement of the elastomer itself. As with silk screening, the elastomeric material's flexible characteristic required that it be supported while in contact with the shadow mask. Supporting the elastomer could not provide enough rigidity to sufficiently control the tolerances of the applied pattern for fine line conductors.

These flexible and heat sensitive properties have restricted previous manufacturing methods in producing elastomeric materials having fine geometry conductors.

Accordingly it would be desirable to have a method for producing accurately placed, fine line conductors in elastomeric materials.

SUMMARY OF THE INVENTION

The objects and advantages of the present invention are achieved by forming a predetermined conductor pattern on a sacrificial substrate. The substrate and patterned conductors are covered with an elastomeric material, which is generally an uncured liquid. The elastomer is cured to form a solid. Then the sacrificial substrate is dissolved away leaving the conductor pattern embedded in the elastomeric material.

DETAILED DESCRIPTION OF THE DRAWINGS

The present invention uses a sacrificial substrate as an intermediate platform on which semiconductor manufacturing techniques are used to form accurately controlled fine line conductors i.e., conductors with features of 50 microns or less. The desired elastomer is applied to the substrate and conductors. Then the substrate is removed by sacrificing it (by dissolving, melting, or other methods) thereby leaving the conductors either attached to or embedded in the elastomer. Since the conductors are formed on a substrate, the flexible properties of the elastomer do not affect conductor placements in the elastomer.

Even though semiconductor manufacturing methods provide the means to produce much smaller and more accurately controlled conductors than previous methods, the sacrificial substrate provides the vehicle to utilize such manufacturing methods. Forming conductors with semiconductor manufacturing methods requires high temperatures that would melt the elastomer. Consequently, these techniques cannot be used directly on elastomers but are facilitated by the sacrificial substrate.

The sacrificial substrate can also be used to improve the forming of conductors on elastomers using the prior art. However, these prior art techniques cannot provide fine, accurately placed conductors that are possible with semiconductor manufacturing techniques.

The various aspects of the invention will be more fully understood from the accompanying figures and descriptions that follow.

Figure 1:
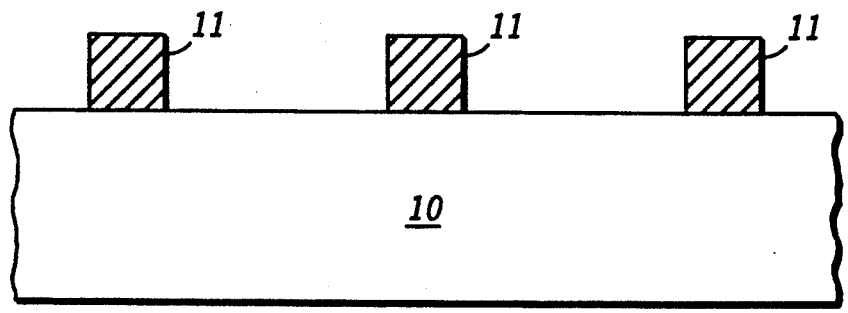
FIG. 1 is an enlarged cutaway side view of a portion of a sacrificial substrate with patterned conductors.

FIG. 1 is an enlarged cutaway side view of a sacrificial substrate with patterned conductors. The present method uses sacrificial substrate 10 as a platform for developing a conductor pattern 11. This sacrificial substrate is a flat, rigid material that can easily be removed from a cured elastomer thereby leaving patterned conductors 11 intact with the elastomer without damaging either the elastomer or the conductors. One such method is to use a substrate 10 made from a material that can be dissolved in a solution that does not affect the conductors or the elastomeric material. One surface of the sacrificial substrate will have the desired conductor pattern applied to it. This pattern will eventually become part of an elastomer.

In the preferred embodiment, substrate 10 is a polished, salt (sodium chloride) plate onto which conductors 11 are formed using semiconductor manufacturing techniques. A photomask with a desired pattern is applied to this salt plate using techniques understood by those familiar in the semiconductor manufacturing arts. Next the conductor material is deposited onto the exposed salt plate areas by sputtering, evaporating, or other deposition techniques that are well known in the semiconductor manufacturing arts. Any conductor material with suitable properties for the application can be used. In the preferred embodiment, a transparent conductor of indium tin oxide is used. The photomask is removed and the salt plate is left with the desired pattern of conductors on its surface.

Deposition and removal properties of some desired conductor materials may necessitate pattern formation by first applying a blanket of conductor material onto the substrate surface, followed by removal of the unwanted material. Generally, this would be accomplished by applying a photomask on the deposited conductor followed by removal of the exposed conductor material. Removing the mask then leaves the desired conductor pattern on the substrate.

Figure 2:
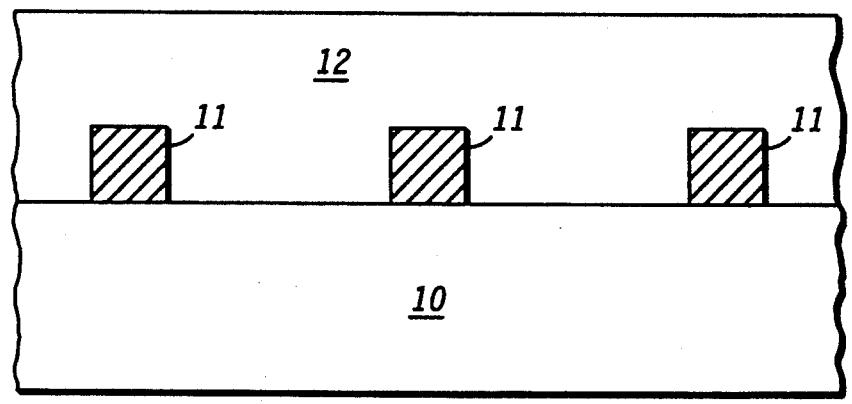
FIG. 2 is the substrate of FIG. 1 after applying an elastomeric material.

FIG. 2 is an enlarged cutaway side view of the patterned substrate after applying an elastomeric material. Elastomeric material 12 with the desired properties is applied covering substrate 10 and conductor pattern 11. The elastomer is usually a dense liquid material that can either be dispensed onto the substrate and spun to distribute it across the substrate as is done with conventional semiconductor manufacturing methods, or poured onto the substrate. For those instances when the elastomer is poured, a form is placed around the substrate to contain the liquid elastomer. Generally these elastomeric materials must be cured to form a solid. Any suitable elastomeric material that adheres well to conductor pattern 11 and preferably cures at room temperature can be used. RTV silicone is an example of such an elastomeric material that would require curing to form into a solid.

Figure 3:
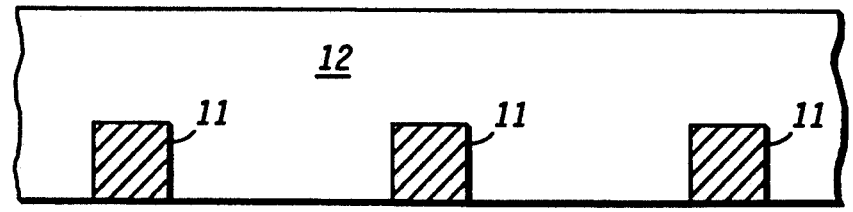
FIG. 3 is an enlarged cutaway cross sectional side view of a conductor pattern embedded in the elastomer.

FIG. 3 is an enlarged cutaway cross sectional side view showing conductor pattern 11 embedded in elastomer 12. Once elastomer 12 has cured, sacrificial substrate 10 is removed leaving conductors 11 in the elastomer. A solvent that does not affect elastomer 12 or conductors 11 is applied to substrate 10 dissolving it and leaving conductor pattern 11 embedded in elastomeric material 12. In the preferred embodiment, the salt plate used for substrate 10 is dissolved with deionized water. Other substrates and removal methods could also be used. One example would be reactive metal substrates, such as a thin aluminum plate, that could readily be dissolved in an acid could be used since acids don't affect most elastomers. For this instance, the aluminum plate thickness would vary depending on the desired rigidity, but an acceptable range would generally be from approximately 25 microns to 100 microns. Another example would be metals or alloys with low melting points such as gallium, which melts at thirty degrees centigrade; Woods metal, an alloy of bismuth, lead, tin, and cadmium which melts at 71 degrees centigrade; or other such low melting point materials. Accordingly, it will be understood that when the term "removing" the substrate is used herein it means dissolving, melting, or any other method of getting rid of substrate 10.

This sacrificial substrate method can also be used to attach conductors to an elastomer's surface instead of embedding them in the elastomer. To attach instead of embed the conductors, the conductors are deposited into recesses formed in the sacrificial substrate's surface. The elastomer is applied, cured, and the substrate is removed as previously explained, but in this case conductors 11 are left on the surface of elastomer 12.

By now it should be appreciated that there has been provided a novel way to manufacture elastomeric materials with embedded or attached fine line conductors.

Using a sacrificial substrate as a platform to form conductors in elastomers eliminates problems created by elastomer movement during conductor formation and permits the use of semiconductor processing techniques for their formation. These semiconductor processing techniques provide accurate control of conductor size and placement. These methods are compatible with current semiconductor manufacturing methods and offer the potential of high volume production as a further advantage.

I claim:

1. A method for forming conductor patterns in flexible elastomeric materials which comprises:
   providing a sacrificial substrate that is substantially planar;
   forming conductor patterns having geometries of less than 50 microns on the substrate by a means that includes evaporating and sputtering;
   coating the conductor pattern and the substrate with a flexible elastomeric material; and
   removing the substrate by a destructive means which includes dissolving and melting, and leaving the patterned conductors in the flexible elastomeric coating.

2. The method of claim 1 further including curing of the flexible elastomeric material before removing the substrate.

3. The method of claim 1 wherein the providing the sacrificial substrate comprises using a salt substrate.

4. A method for attaching conductors to a flexible elastomeric material which comprises:
   depositing a conductor material into a predetermined pattern of recesses in a sacrificial substrate by using semiconductor processing techniques to form small geometry conductors;
   applying a flexible elastomeric material covering the conductors and the substrate; and
   dissolving the substrate in a solvent leaving the conductors on the flexible elastomeric material.

5. The method of claim 4 further including curing of the flexible elastomeric material before dissolving the substrate.

6. A method for providing small geometry conductors in a flexible elastomeric material which comprises:
   providing a sacrificial substrate that is substantially planar;
   applying a mask having a predetermined pattern onto the sacrificial substrate;
   depositing a conductor material through the mask and onto the substrate and forming conductors having geometries of less than 50 microns;
   removing the mask;
   covering the substrate and the conductors with a flexible elastomeric material; and
   removing the substrate by a means that includes dissolving and melting, and leaving the conductors in the flexible elastomeric material.

7. The method of claim 1 wherein the forming conductor patterns step includes depositing conductor material onto the substrate, then applying a mask to the conductor material and removing the conductor material not covered by the mask thereby leaving a predetermined pattern of conductors having geometries of less than 50 microns on the substrate.

8. The method of claim 6 wherein the depositing a conductor step comprises using an indium tin oxide material.

9. The method of claim 6 further including curing of the flexible elastomeric material before removing the substrate.

10. The method of claim 1 wherein coating the conductor pattern and the substrate with the flexible elastomeric material includes coating the conductor pattern and the substrate with a silicone elastomer.

11. The method of claim 4 wherein applying the flexible elastomeric material includes applying a silicone elastomer.

12. The method of claim 6 wherein covering the substrate and the conductors with the flexible elastomeric material includes covering the substrate and the conductors with a silicone elastomer.

13. The method of claim 1 wherein removing the substrate includes melting a gallium substrate.

14. The method of claim 6 wherein removing the substrate includes melting a Woods metal substrate.

* * * * *